(12) United States Patent
He et al.

(10) Patent No.: US 10,192,617 B2
(45) Date of Patent: Jan. 29, 2019

(54) CIRCUIT AND ARRAY CIRCUIT FOR IMPLEMENTING SHIFT OPERATION

(71) Applicant: Huawei Technologies Co., Ltd., Shenzhen, Guangdong (CN)

(72) Inventors: Rui He, Hangzhou (CN); Ronggang Xu, Shenzhen (CN); Junfeng Zhao, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 15/473,350

(22) Filed: Mar. 29, 2017

(65) Prior Publication Data

US 2017/0206958 A1  Jul. 20, 2017

Related U.S. Application Data

(63) Continuation of application No. PCT/CN2014/087967, filed on Sep. 30, 2014.

(51) Int. Cl.

| G11C 19/00 | (2006.01) |
| G11C 13/00 | (2006.01) |
| G11C 19/28 | (2006.01) |
| G11C 14/00 | (2006.01) |
| H03K 3/356 | (2006.01) |

(52) U.S. Cl.
CPC ........ *G11C 13/004* (2013.01); *G11C 13/0069* (2013.01); *G11C 13/0097* (2013.01); *G11C 14/009* (2013.01); *G11C 19/28* (2013.01); *G11C 19/287* (2013.01); *H03K 3/356104* (2013.01); *H03K 3/356113* (2013.01); *H03K 3/356121* (2013.01); *G11C 2013/0073* (2013.01)

(58) Field of Classification Search
None
See application file for complete search history.

(56) References Cited

U.S. PATENT DOCUMENTS

| 2007/0002618 A1 | 1/2007 | Schoenauer et al. |
| 2014/0149773 A1 | 5/2014 | Huang et al. |
| 2015/0077319 A1 | 3/2015 | Yao et al. |
| 2017/0040982 A1* | 2/2017 | Miao .................. G11C 13/0002 |
| 2017/0206958 A1* | 7/2017 | He .......................... G11C 19/28 |

FOREIGN PATENT DOCUMENTS

| CN | 102881333 A | 1/2013 |
| CN | 103345941 A | 10/2013 |
| CN | 103632726 A | 3/2014 |
| CN | 103886910 A | 6/2014 |
| EP | 0631289 A2 | 12/1994 |
| JP | 1307999 A | 12/1989 |
| JP | 10233661 A | 9/1998 |
| WO | 2013062596 A1 | 5/2013 |

\* cited by examiner

*Primary Examiner* — Long Nguyen (57) ABSTRACT

A circuit and an array circuit for implementing a shift operation are provided. The circuit for implementing a shift operation includes a resistive random-access memory and four switches. The circuit has a simple structure and can improve computational efficiency.

10 Claims, 5 Drawing Sheets

CIRCUIT AND ARRAY CIRCUIT FOR IMPLEMENTING SHIFT OPERATION

CROSS-REFERENCE TO RELATED APPLICATIONS

This application is a continuation of International Application No. PCT/CN2014/087967, filed on Sep. 30, 2014, the disclosure of which is hereby incorporated by reference in its entirety.

TECHNICAL FIELD

Embodiments of the present invention relate to the computer field, and in particular, to a circuit and an array circuit for implementing a shift operation.

BACKGROUND

In a computing system, a shift operation is a basic operation. In the prior art, a circuit for implementing a shift operation includes a resistive random-access memory square array and a current-sensitive module. Positive input ends of resistive random-access memories in a same column of the resistive random-access memory square array are connected, so that the positive input ends of the resistive random-access memories in the same column are used as signal input ports. Negative input ends of resistive random-access memories in a same row of the resistive random-access memory square array are connected to an input end of a current-sensitive module, so that an output end of the current-sensitive module is used as a signal output port. The input end of the current-sensitive module is at a low level when the input end of the current-sensitive module works. The output end of the current-sensitive module outputs a high level when a current received at the input end of the current-sensitive module is greater than a threshold current; the output end of the current-sensitive module outputs a low level when a current received at the input end of the current-sensitive module is less than a threshold current. A user sets a corresponding resistive random-access memory in the resistive random-access memory square array in a low impedance state according to a sequence that needs to be shifted. Equivalently, a to-be-shifted data line is connected, and through the resistive random-access memory square array, shifted sequences are obtained from all output ends of all current-sensitive modules, so that a shift operation is implemented.

However, during implementation of a shift operation by using the method in the prior art, a circuit structure is complex, and computational efficiency is low.

SUMMARY

Embodiments of the present invention provide a circuit and an array circuit for implementing a shift operation, so that a circuit structure is simple and computational efficiency can be improved.

A first aspect of the embodiments of the present invention provides a circuit for implementing a shift operation, where the circuit includes:
a resistive random-access memory, a first switch, a second switch, a third switch, and a fourth switch, where
the first switch is closed when a first end of the first switch is at a low level, the second switch is closed when a first end of the second switch is at a high level, the third switch is closed when a first end of the third switch is at a high level, and the fourth switch is closed when a first end of the fourth switch is at a low level;
a second end of the first switch and a second end of the third switch are connected to a negative input end of the resistive random-access memory;
a second end of the second switch and a second end of the fourth switch are connected to a positive input end of the resistive random-access memory;
the first end of the first switch, the first end of the second switch, the first end of the third switch, and the first end of the fourth switch are connected to an output end of a previous-stage circuit for implementing a shift operation;
a third end of the first switch and a third end of the second switch are connected to a bias voltage end; and
a third end of the third switch and a third end of the fourth switch are connected to a ground end.

With reference to the first aspect, in a first possible implementation manner of the first aspect, when the circuit for implementing a shift operation is a left shift circuit, the output end of the previous-stage circuit for implementing a shift operation is an output end of a circuit corresponding to right 1-bit data.

With reference to the first aspect, in a second possible implementation manner of the first aspect, when the circuit for implementing a shift operation is a right shift circuit, the output end of the previous-stage circuit for implementing a shift operation is an output end of a circuit corresponding to left 1-bit data.

With reference to the first aspect, in a third possible implementation manner of the first aspect, the circuit further includes a first selection circuit; where
the first selection circuit includes a left input end, a right input end, a first selection end, a fifth switch, and a sixth switch, where
the left input end is connected to a right output end of a circuit corresponding to left 1-bit data, and the right input end is connected to a left output end of a circuit corresponding to right 1-bit data; and
the fifth switch is closed when a first end of the fifth switch is at a low level, the sixth switch is closed when a first end of the sixth switch is at a high level, the first end of the fifth switch and the first end of the sixth switch are connected to the first selection end, a second end of the fifth switch is used as the left input end, a second end of the sixth switch is used as the right input end, and a third end of the fifth switch, a third end of the sixth switch, the first end of the first switch, the first end of the second switch, the first end of the third switch, and the first end of the fourth switch are connected.

With reference to the third possible implementation manner of the first aspect, in a fourth possible implementation manner of the first aspect, the circuit further includes a second selection circuit and a read circuit, where
the second selection circuit includes a seventh switch, an eighth switch, a ninth switch, a tenth switch, and a second selection end, where the seventh switch is closed when a first end of the seventh switch is at a high level, the eighth switch is closed when a first end of the eighth switch is at a low level, the ninth switch is closed when a first end of the ninth switch is at a low level, and the tenth switch is closed when a first end of the tenth switch is at a high level;
the first end of the seventh switch, the first end of the eighth switch, the first end of the ninth switch, and the first end of the tenth switch are connected to the second selection end;

a third end of the seventh switch, a third end of the eighth switch, the first end of the first switch, the first end of the second switch, the first end of the third switch, and the first end of the fourth switch are connected;

a second end of the seventh switch is connected to the ground end;

a second end of the eighth switch, the third end of the fifth switch, and the third end of the sixth switch are connected;

a second end of the ninth switch, a second end of the tenth switch, the third end of the third switch, and the third end of the fourth switch are connected;

a third end of the ninth switch is connected to the ground end; and a third end of the tenth switch is connected to the read circuit; and the read circuit includes a latch, a right output end, and a left output end, where the right output end is connected to a left input end of the circuit corresponding to the right 1-bit data, and the left output end is connected to a right input end of the circuit corresponding to the left 1-bit data; and a first end of the latch is connected to the second selection end, a third end of the latch is connected to the third end of the tenth switch, and a second end of the latch is used as the right output end or the left output end.

A second aspect of the embodiments of the present invention provides an array circuit for implementing a shift operation, where the array circuit includes at least two circuit units for implementing a shift operation, where the circuit unit for implementing a shift operation includes:

a resistive random-access memory, a first switch, a second switch, a third switch, and a fourth switch, where the first switch is closed when a first end of the first switch is at a low level, the second switch is closed when a first end of the second switch is at a high level, the third switch is closed when a first end of the third switch is at a high level, and the fourth switch is closed when a first end of the fourth switch is at a low level;

a second end of the first switch and a second end of the third switch are connected to a negative input end of the resistive random-access memory;

a second end of the second switch and a second end of the fourth switch are connected to a positive input end of the resistive random-access memory;

the first end of the first switch, the first end of the second switch, the first end of the third switch, and the first end of the fourth switch are connected to an output end of a previous-stage circuit unit for implementing a shift operation;

a third end of the first switch and a third end of the second switch are connected to a bias voltage end; and a third end of the third switch and a third end of the fourth switch are connected to a ground end.

With reference to the second aspect, in a first possible implementation manner of the second aspect, when the array circuit for implementing a shift operation is a left shift array circuit, the output end of the previous-stage circuit unit for implementing a shift operation is an output end of a circuit unit corresponding to right 1-bit data.

With reference to the second aspect, in a second possible implementation manner of the second aspect, when the array circuit for implementing a shift operation is a right shift array circuit, the output end of the previous-stage circuit unit for implementing a shift operation is an output end of a circuit unit corresponding to left 1-bit data.

With reference to the second aspect, in a third possible implementation manner of the second aspect, the circuit unit for implementing a shift operation further includes a first selection circuit; where the first selection circuit includes a left input end, a right input end, a first selection end, a fifth switch, and a sixth switch, where the left input end is connected to a right output end of a circuit unit corresponding to left 1-bit data, and the right input end is connected to a left output end of a circuit unit corresponding to right 1-bit data; and the fifth switch is closed when a first end of the fifth switch is at a low level, the sixth switch is closed when a first end of the sixth switch is at a high level, the first end of the fifth switch and the first end of the sixth switch are connected to the first selection end, a second end of the fifth switch is used as the left input end, a second end of the sixth switch is used as the right input end, and a third end of the fifth switch, a third end of the sixth switch, the first end of the first switch, the first end of the second switch, the first end of the third switch, and the first end of the fourth switch are connected; and first selection ends of the at least two circuit units for implementing a shift operation are connected.

With reference to the third possible implementation manner of the second aspect, in a fourth possible implementation manner of the second aspect, the circuit unit for implementing a shift operation further includes a second selection circuit and a read circuit, where the second selection circuit includes a seventh switch, an eighth switch, a ninth switch, a tenth switch, and a second selection end, where the seventh switch is closed when a first end of the seventh switch is at a high level, the eighth switch is closed when a first end of the eighth switch is at a low level, the ninth switch is closed when a first end of the ninth switch is at a low level, and the tenth switch is closed when a first end of the tenth switch is at a high level;

the first end of the seventh switch, the first end of the eighth switch, the first end of the ninth switch, and the first end of the tenth switch are connected to the second selection end;

a third end of the seventh switch, a third end of the eighth switch, the first end of the first switch, the first end of the second switch, the first end of the third switch, and the first end of the fourth switch are connected;

a second end of the seventh switch is connected to the ground end;

a second end of the eighth switch, the third end of the fifth switch, and the third end of the sixth switch are connected;

a second end of the ninth switch, a second end of the tenth switch, the third end of the third switch, and the third end of the fourth switch are connected;

a third end of the ninth switch is connected to the ground end; and a third end of the tenth switch is connected to the read circuit;

the read circuit includes a latch, a right output end, and a left output end, where the right output end is connected to a left input end of the circuit unit corresponding to the right 1-bit data, and the left output end is connected to a right input end of the circuit unit corresponding to the left 1-bit data; and a first end of the latch is connected to the second selection end, a third end of the latch is connected to the third end of the tenth switch, and a second end of the latch is used as the right output end or the left output end; and second selection ends of the at least two circuit units for implementing a shift operation are connected.

The embodiments of the present invention provide a circuit and an array circuit for implementing a shift operation. The circuit for implementing a shift operation includes a resistive random-access memory, a first switch, a second switch, a third switch, and a fourth switch, where the first switch is closed when a first end of the first switch is at a low level, the second switch is closed when a first end of the second switch is at a high level, the third switch is closed when a first end of the third switch is at a high level, and the fourth switch is closed when a first end of the fourth switch is at a low level; a second end of the first switch and a second end of the third switch are connected to a negative input end of the resistive random-access memory; a second end of the second switch and a second end of the fourth switch are connected to a positive input end of the resistive random-access memory; the first end of the first switch, the first end of the second switch, the first end of the third switch, and the first end of the fourth switch are connected to an output end of a previous-stage circuit for implementing a shift operation; a third end of the first switch and a third end of the second switch are connected to a bias voltage end; and a third end of the third switch and a third end of the fourth switch are connected to a ground end. The shift circuit in the embodiments has a simple structure, consisting of four switches and one resistive random-access memory, and can improve computational efficiency.

BRIEF DESCRIPTION OF THE DRAWINGS

To describe the technical solutions in embodiments of the present invention more clearly, the following briefly describes the accompanying drawings required for describing the embodiments or the prior art.

DETAILED DESCRIPTION

The following clearly describes the technical solutions in embodiments of the present invention with reference to the accompanying drawings in the embodiments of the present invention. Apparently, the described embodiments are merely some but not all of the embodiments of the present invention.

As computer technologies develop, people have an increasingly high requirement for computational efficiency. A circuit for implementing a shift operation is one of basic circuit units of a computer and has wide applications. Therefore, an improvement of the computational efficiency of a shift operation directly affects computational efficiency of an entire computing system. A circuit and an array circuit for implementing a shift operation that are provided in the embodiments of the present invention may be a stand-alone application, or may implement a more complex function with another circuit.

Specific embodiments are used in the following to describe in detail the technical solutions of the present invention. The following several specific embodiments may be combined with each other, and a same or similar concept or process may be not described repeatedly in some embodiments.

Figure 1:
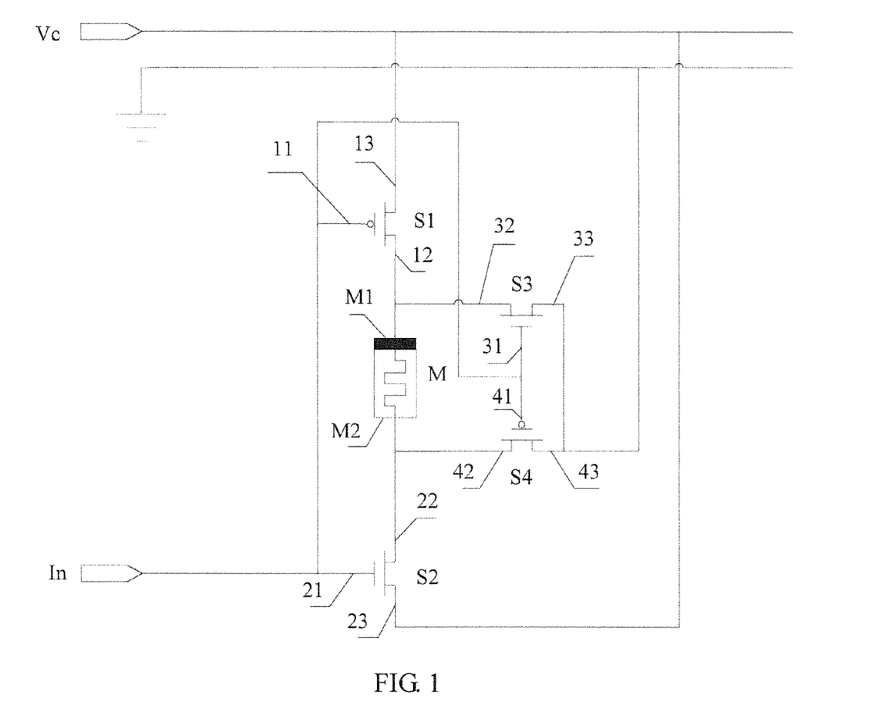
FIG. 1 is a schematic structural diagram of a first embodiment of a circuit for implementing a shift operation according to the present invention.

FIG. 1 is a schematic structural diagram of a first embodiment of a circuit for implementing a shift operation according to the present invention. As shown in FIG. 1, for ease of illustration, a MOS switch is used as an example of a switch in FIG. 1. A person skilled in the art may understand that the switch in this embodiment may further be a junction field effect transistor or another type of voltage-controlled switch. As shown in FIG. 1, the circuit for implementing a shift operation in this embodiment includes:

a resistive random-access memory M, a first switch S1, a second switch S2, a third switch S3, and a fourth switch S4, where the first switch S1 is closed when a first end 11 of the first switch S1 is at a low level, the second switch S2 is closed when a first end 21 of the second switch S2 is at a high level, the third switch S3 is closed when a first end 31 of the third switch S3 is at a high level, and the fourth switch S4 is closed when a first end 41 of the fourth switch S4 is at a low level; a second end 12 of the first switch S1 and a second end 32 of the third switch S3 are connected to a negative input end M1 of the resistive random-access memory M; a second end 22 of the second switch S2 and a second end 42 of the fourth switch S4 are connected to a positive input end M2 of the resistive random-access memory M; the first end 11 of the first switch S1, the first end 21 of the second switch S2, the first end 31 of the third switch S3, and the first end 41 of the fourth switch S4 are connected to an output end of a previous-stage circuit for implementing a shift operation; a third end 13 of the first switch S1 and a third end 23 of the second switch S2 are connected to a bias voltage end; and a third end 33 of the third switch S3 and a third end 43 of the fourth switch S4 are connected to a ground end.

The resistive random-access memory (RRAM) is a memory that stores various information by using such a feature that a resistance of a material of the resistive random-access memory correspondingly changes between a high impedance state and a low impedance state to make or break a current flow path according to different voltages applied to the resistive random-access memory. The resistive random-access memory presents a low impedance state when a difference between a voltage of the positive input end of the resistive random-access memory and a voltage of the negative input end of the resistive random-access memory is not less than a set voltage of the resistive random-access memory; the resistive random-access memory presents a high impedance state when a difference between a voltage of the positive input end of the resistive random-access memory and a voltage of the negative input end of the resistive random-access memory is not greater than a reset voltage of the resistive random-access memory.

When data recorded in the previous-stage circuit for implementing a shift operation is logic 0, that is, when output of an output circuit of the previous-stage circuit for implementing a shift operation is a low level, the first switch S1 and the fourth switch S4 are closed, and the second switch S2 and the third switch S3 are open. A reverse voltage Vc is applied to the resistive random-access memory M to enable the resistive random-access memory to be reset to enter a high impedance state, and recorded data is logic 0, that is, the data recorded in the previous-stage circuit for implementing a shift operation is shifted into a resistive random-access memory of a current-stage circuit.

When data recorded in the previous-stage circuit for implementing a shift operation is logic 1, that is, when output of an output circuit of the previous-stage circuit for implementing a shift operation is a high level, the second switch S2 and the third switch S3 are closed, and the first switch S1 and the fourth switch S4 are open. A forward voltage Vc is applied to the resistive random-access memory M to enable the resistive random-access memory to be set to enter a low impedance state, and recorded data is logic 1, that is, the data recorded in the previous-stage circuit for implementing a shift operation is shifted into a resistive random-access memory of a current-stage circuit.

If the output end of the previous-stage circuit for implementing a shift operation is an output end of a circuit corresponding to right 1-bit data, the foregoing circuit for implementing a shift operation can implement a left shift operation.

If the output end of the previous-stage circuit for implementing a shift operation is an output end of a circuit corresponding to left 1-bit data, the foregoing circuit for implementing a shift operation can implement a right shift operation.

In this embodiment, the circuit for implementing a shift operation includes a resistive random-access memory, a first switch, a second switch, a third switch, and a fourth switch, where the first switch is closed when a first end of the first switch is at a low level, the second switch is closed when a first end of the second switch is at a high level, the third switch is closed when a first end of the third switch is at a high level, and the fourth switch is closed when a first end of the fourth switch is at a low level; a second end of the first switch and a second end of the third switch are connected to a negative input end of the resistive random-access memory; a second end of the second switch and a second end of the fourth switch are connected to a positive input end of the resistive random-access memory; the first end of the first switch, the first end of the second switch, the first end of the third switch, and the first end of the fourth switch are connected to an output end of a previous-stage circuit for implementing a shift operation; a third end of the first switch and a third end of the second switch are connected to a bias voltage end; and a third end of the third switch and a third end of the fourth switch are connected to a ground end. The shift circuit in this embodiment has a simple structure, consisting of four switches and one resistive random-access memory, and can improve computational efficiency. In addition, both data before shifting and data after shifting are stored in the resistive random-access memory, and data do not need to be read from the resistive random-access memory and then stored into the resistive random-access memory after computation, which significantly lowers a demand for memory bandwidth and implements a fusion of computation and storage.

Figure 2:
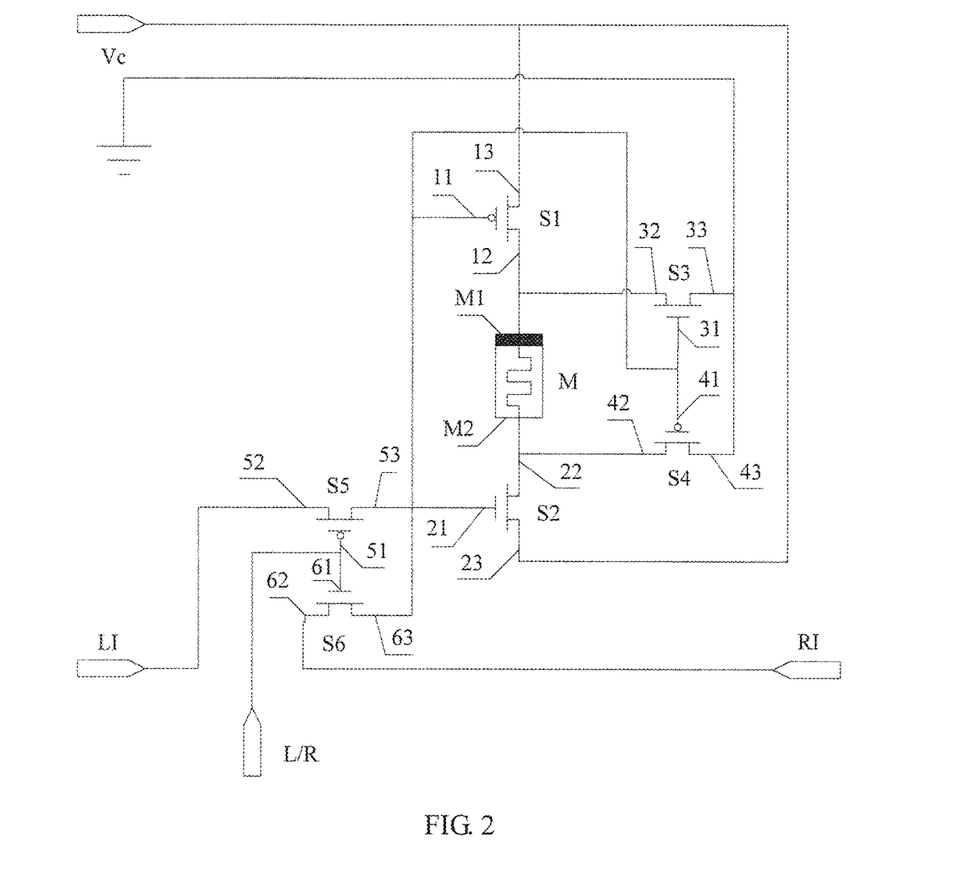
FIG. 2 is a schematic structural diagram of a second embodiment of a circuit for implementing a shift operation according to the present invention.

FIG. 2 is a schematic structural diagram of a second embodiment of a circuit for implementing a shift operation according to the present invention. Based on the circuit shown in FIG. 1, the circuit in FIG. 2 further includes a first selection circuit, where the first selection circuit is configured to choose to perform a left shift operation or perform a right shift operation. As shown in FIG. 2, the first selection circuit includes a left input end LI, a right input end RI, a first selection end L/R, a fifth switch S5, and a sixth switch S6, where the left input end LI is connected to a right output end of a circuit corresponding to left 1-bit data, and the right input end RI is connected to a left output end of a circuit corresponding to right 1-bit data; and the fifth switch S5 is closed when a first end 51 of the fifth switch S5 is at a low level, the sixth switch S6 is closed when a first end 61 of the sixth switch S6 is at a high level, the first end 51 of the fifth switch S5 and the first end 61 of the sixth switch S6 are connected to the first selection end L/R, a second end 52 of the fifth switch S5 is connected to the left input LI, a second end 62 of the sixth switch S6 is used as the foregoing right input end RI, and a third end 53 of the fifth switch S5, a third end 63 of the sixth switch S6, the first end 11 of the first switch S1, the first end 21 of the second switch S2, the first end 31 of the third switch S3, and the first end 41 of the fourth switch S4 are connected.

When the first selection end L/R is at a high level, the fifth switch S5 is open, the sixth switch S6 is closed, and the circuit shown in FIG. 2 stores the right 1-bit data from the foregoing right input end RI into the resistive random-access memory M, so as to implement a left shift operation.

Data before left shifting and data after left shifting are shown in the following Table 1, where x represents that data in the resistive random-access memory is independent, and D0 represents data at the right input end RI.

TABLE 1

Table of data before left shifting and data after left shifting

|  | M | RI |
|---|---|---|
| Before shifting | x | D0 |
| After shifting | D0 | x |

When the first selection end L/R is at a low level, the fifth switch S5 is closed, the sixth switch S6 is open, and the circuit shown in FIG. 2 stores the left 1-bit data from the left input end LI into the resistive random-access memory M, so as to implement a right shift operation.

Data before right shifting and data after right shifting are shown in the following table, where x represents that data in the resistive random-access memory is independent, and D1 represents data at the left input end LI.

TABLE 2

Table of data before right shifting and data after right shifting

|  | LI | M |
|---|---|---|
| Before shifting | D1 | x |
| After shifting | x | D1 |

For a same part in the embodiment shown in FIG. 2 and in the embodiment shown in FIG. 1, refer to detailed descriptions in FIG. 1, and details are not described repeatedly herein.

In the embodiment shown in FIG. 2, the circuit can be controlled to implement a left shift operation or a right shift operation by adding a first selection circuit. The first selection circuit includes a left input end, a right input end, a first selection end, a fifth switch, and a sixth switch, where the left input end is connected to a right output end of a circuit corresponding to left 1-bit data, and the right input end is connected to a left output end of a circuit corresponding to right 1-bit data; and the fifth switch is closed when a first end of the fifth switch is at a low level, the sixth switch is closed when a first end of the sixth switch is at a high level, the first end of the fifth switch and the first end of the sixth switch are connected to the first selection end, a second end of the fifth switch is used as the left input end, a second end of the sixth switch is used as the right input end, and a third end of the fifth switch, a third end of the sixth switch, a first end of a first switch, a first end of a second switch, a first end of a third switch, and a first end of a fourth switch are connected.

Figure 3:
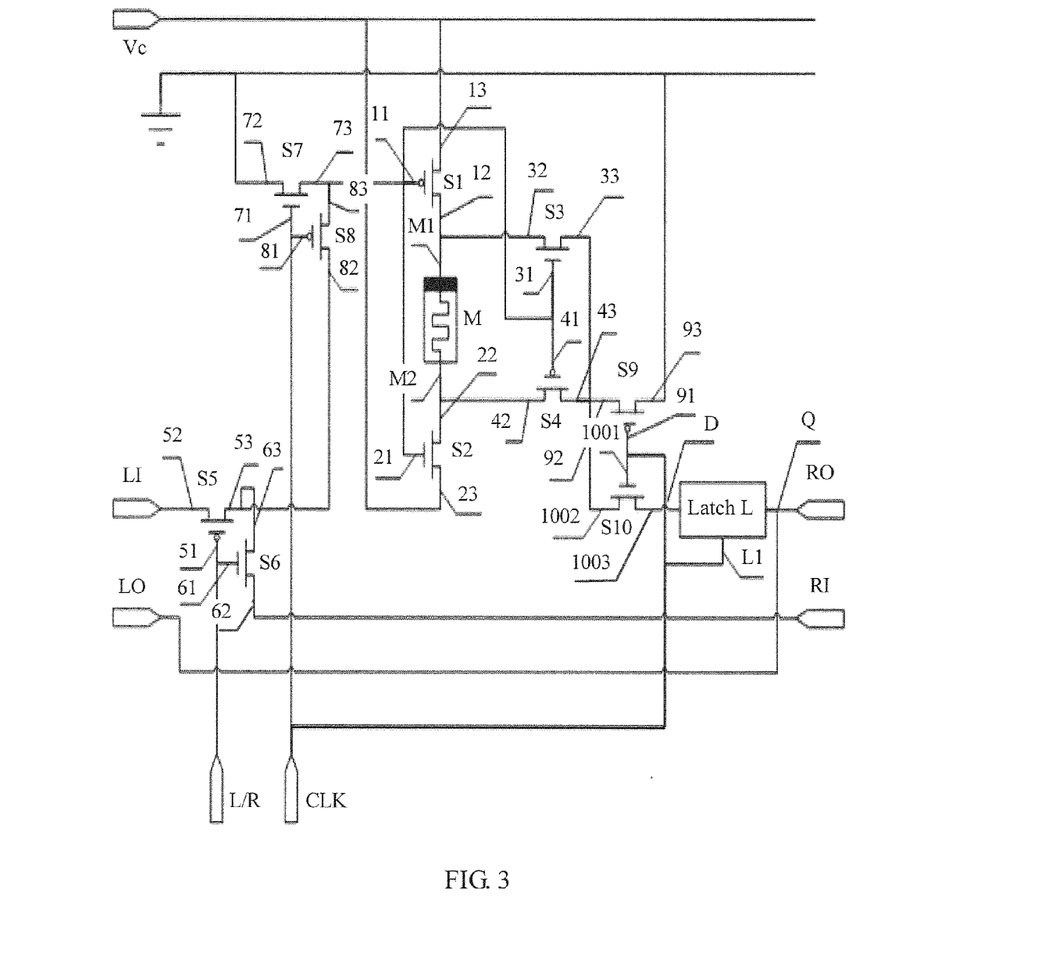
FIG. 3 is a schematic structural diagram of a third embodiment of a circuit for implementing a shift operation according to the present invention.

FIG. 3 is a schematic structural diagram of a third embodiment of a circuit for implementing a shift operation according to the present invention. Based on the circuit shown in FIG. 2, the circuit in FIG. 3 further includes a second selection circuit and a read circuit, where the second selection circuit is configured to determine whether the circuit performs a shift operation or performs a read operation. The second selection circuit includes a seventh switch S7, an eighth switch S8, a ninth switch S9, a tenth switch S10, and a second selection end CLK, where the seventh switch S7 is closed when a first end 71 of the seventh switch S7 is at a high level, the eighth switch S8 is closed when a first end 81 of the eighth switch S8 is at a low level, the ninth switch S9 is closed when a first end 91 of the ninth switch S9 is at a low level, and the tenth switch S10 is closed when a first end 1001 of the tenth switch S10 is at a high level; the first end 71 of the seventh switch S7, the first end 81 of the eighth switch S8, the first end 91 of the ninth switch S9, and the first end 1001 of the tenth switch S10 are connected to the second selection end CLK; a third end 73 of the seventh switch S7, a third end 83 of the eighth switch S8, the first end 11 of the first switch S1, the first end 21 of the second switch S2, the first 31 of the third switch S3, and the first end 41 of the fourth switch S4 are connected; a second end 72 of the seventh switch S7 is connected to the ground end; a second end 82 of the eighth switch S8, the third end 53 of the fifth switch S5, and the third end 63 of the sixth switch Share connected; a second end 92 of the ninth switch S9, a second end 1002 of the tenth switch S10, the third end 33 of the third switch S3, and the third end 43 of the fourth switch S4 are connected; a third end 93 of the ninth switch S9 is connected to the ground end; and a third end 1003 of the tenth switch S10 is connected to the read circuit.

The read circuit includes a latch L, a right output end RO, and a left output end LO, where the right output end RO is connected to a left input end of the circuit corresponding to the right 1-bit data, and the left output end LO is connected to a right input end of the circuit corresponding to the left 1-bit data; and a first end L1 of the latch L is connected to the second selection end CLK, a third end D of the latch L is connected to the third end 1003 of the tenth switch S10, and a second end Q of the latch L is used as the foregoing right output end RO or the left output end LO.

The first end L1 of the latch L is a control end. When input of the control end is a low level, the latch stores previous input of the third end D of the latch; when input of the control end is a high level, input of the third end D of the latch keeps consistent with output of the second end Q of the latch.

A right shift operation is implemented as follows:
implementing a right shift operation when input of the first selection end L/R is a low level, where in this case, the fifth switch S5 is closed and the sixth switch S6 is open; and performing a shift operation when input of the second selection end CLK is a low level, where in this case, the seventh switch S7 and the tenth switch S10 are open, the eighth switch S8 and the ninth switch S9 are closed, a value at the left input end LI is stored into the resistive random-access memory M, and the latch enters a lock state to keep a level of the right output end RO stable; or performing a read operation when input of the second selection end CLK is a high level, where in this case, the second switch S2, the third switch S3, the eighth switch S8, and the ninth switch S9 are open; and the first switch S1, the fourth switch S4, the seventh switch S7, and the tenth switch S10 are closed; and when the resistive random-access memory M is in a high impedance state, a low level is input to the latch, that is, a value represented by the resistive random-access memory M is read and stored into the latch; when the resistive random-access memory M is in a low impedance state, a high level is input to the latch, that is, a value represented by the resistive random-access memory M is read and stored into the latch, and an input signal of the latch is exported to the right output end RO at the same time, where the high impedance state represents logic "0" and the low impedance state represents logic "1".

It can be learned from the foregoing description that during one clock cycle, the foregoing circuit outputs the value represented by the resistive random-access memory M into the right output end RO, and records the left 1-bit data in the current-stage resistive random-access memory M by using the left input end, thereby implementing 1-bit right shifting.

A left shift operation is implemented as follows:
implementing, by the foregoing circuit, a left shift operation when an input signal of the first selection end L/R is a high level, where in this case, the fifth switch S5 is open and the sixth switch S6 is closed; and performing a shift operation when the second selection end CLK is at a low level, where in this case, the seventh switch S7 and the tenth switch S10 are open, the eighth switch S8 and the ninth switch S9 are closed, a value that is input at the right input end RI is stored into the resistive random-access memory M, and the latch enters a lock state to keep a level of the left output end LO stable; or performing a read operation when the second selection end CLK is at a high level, where in this case, the second switch S2, the third switch S3, the eighth switch S8, and the ninth switch S9 are open; and the first switch S1, the fourth switch S4, the seventh switch S7, and the tenth switch S10 are closed; and when the resistive random-access memory M is in a high impedance state, a low level is input to the latch; when the resistive random-access memory M is in a low impedance state, a high level is input to the latch, and an input signal of the latch L is exported to the left output end LO, where the high impedance state represents logic "0" and the low impedance state represents logic "1".

It can be learned that during one clock cycle, the foregoing circuit outputs the value represented by the resistive random-access memory M into the left output end LO, and records the right 1-bit data in the current-stage resistive random-access memory M by using a right input end RI, thereby implementing 1-bit left shifting.

Figure 4:
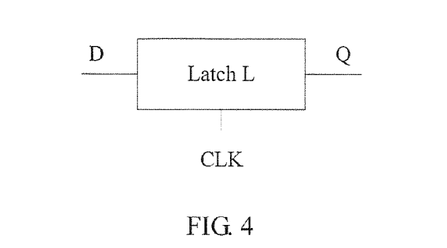
FIG. 4 is a schematic structural diagram of a latch according to the present invention.

In the embodiment shown in FIG. 3, a diagram of the latch is shown in FIG. 4. FIG. 4 is a schematic structural diagram of a latch according to the present invention, and a truth table of the latch is shown in Table 3:

| CLK | D | Q |
|-----|---|---|
| 0 | x | Unchanged |
| 1 | 0 | 0 |
| 1 | 1 | 1 |

Figure 5:
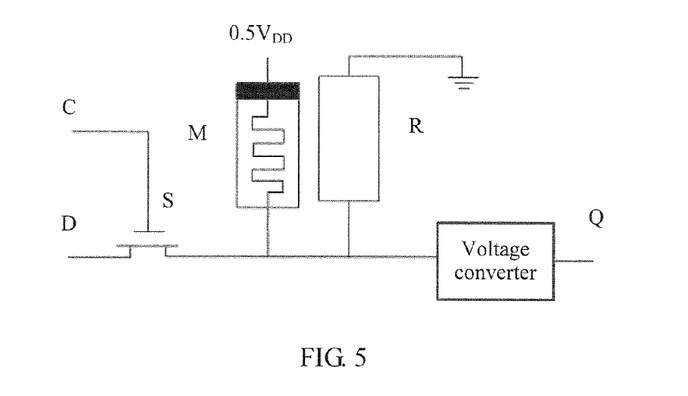
FIG. 5 is another schematic structural diagram of a latch according to the present invention.

That is, when input of the second selection end CLK is a low level, the latch keeps previous input unchanged; when input of the second selection end CLK is a high level, input of the third end D of the latch L keeps consistent with output of the second end Q of the latch L. Specific implementation of the latch may be implementation by using a traditional MOS transistor or implementation by using a resistive random-access memory. FIG. 5 is another schematic structural diagram of a latch according to the present invention. As shown in FIG. 5, the latch includes a resistive random-access memory M, a resistor R, a voltage converter, and a MOS transistor, where a first end of the MOS transistor is connected to a control signal C, a second end of the MOS transistor is used as a third end D of the latch, a third end of the MOS transistor, one end of the voltage converter, and one end of the resistor R are connected to a positive input end of the resistive random-access memory M, 0.5 VDD is connected to a negative input end of the resistive random-access memory M, the other end of the resistor R is connected to a ground end, and the other end of the voltage converter is used as a second end Q of the latch.

Figure 6:
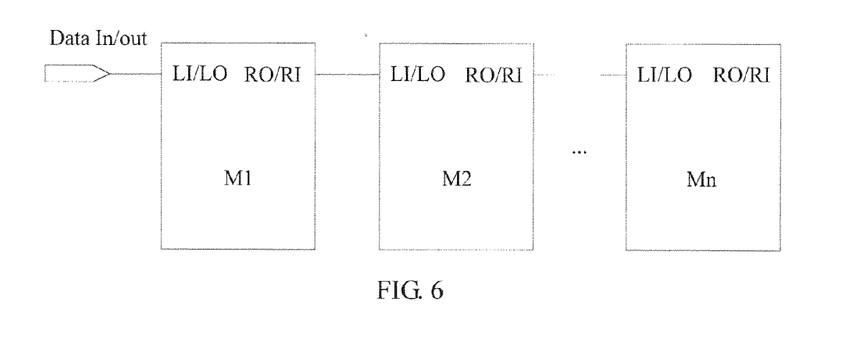
FIG. 6 is a schematic structural diagram of a first embodiment of an array circuit for implementing a shift operation according to the present invention.

FIG. 6 is a schematic structural diagram of a first embodiment of an array circuit for implementing a shift operation according to the present invention. The array circuit includes at least two circuit units for implementing a shift operation, where each circuit unit is packaged by using the circuit for implementing a shift operation shown in FIG. 1. The circuit unit for implementing a shift operation is specifically shown in FIG. 1 and specially includes a resistive random-access memory, a first switch, a second switch, a third switch, and a fourth switch, where the foregoing first switch is closed when a first end of the foregoing first switch is at a low level, the foregoing second switch is closed when a first end of the foregoing second switch is at a high level, the foregoing third switch is closed when a first end of the foregoing third switch is at a high level, and the foregoing fourth switch is closed when a first end of the foregoing fourth switch is at a low level; a second end of the foregoing first switch and a second end of the foregoing third switch are connected to a negative input end of the foregoing resistive random-access memory; a second end of the foregoing second switch and a second end of the foregoing fourth switch are connected to a positive input end of the foregoing resistive random-access memory; the first end of the foregoing first switch, the first end of the foregoing second switch, the first end of the foregoing third switch, and the first end of the foregoing fourth switch are connected to an output end of a previous-stage circuit unit for implementing a shift operation; a third end of the foregoing first switch and a third end of the foregoing second switch are connected to a bias voltage end; and a third end of the foregoing third switch and a third end of the foregoing fourth switch are connected to a ground end.

In the embodiment shown in FIG. 6, when the array circuit for implementing a shift operation is a left shift array circuit, the output end of the previous-stage circuit unit for implementing a shift operation is an output end of a circuit unit corresponding to right 1-bit data.

In the embodiment shown in FIG. 6, when the array circuit for implementing a shift operation is a right shift array circuit, the output end of the previous-stage circuit unit for implementing a shift operation is an output end of a circuit unit corresponding to left 1-bit data.

Figure 7:
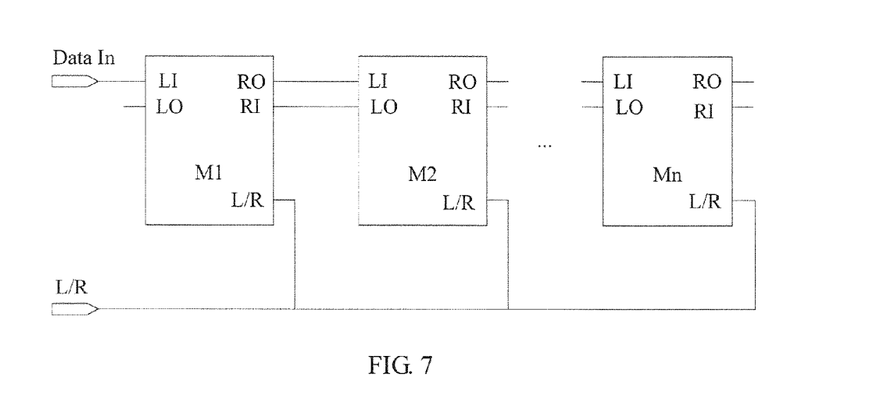
FIG. 7 is a schematic structural diagram of a second embodiment of an array circuit for implementing a shift operation according to the present invention.

FIG. 7 is a schematic structural diagram of a second embodiment of an array circuit for implementing a shift operation according to the present invention. Based on the array circuit shown in FIG. 6, the circuit unit for implementing a shift operation in FIG. 7 further includes a first selection circuit. The foregoing first selection circuit includes a left input end, a right input end, a first selection end, a fifth switch, and a sixth switch, where the foregoing left input end is connected to a right output end of the circuit unit corresponding to the left 1-bit data, and the foregoing right input end is connected to a left output end of the circuit unit corresponding to the right 1-bit data; and the foregoing fifth switch is closed when a first end of the foregoing fifth switch is at a low level, the foregoing sixth switch is closed when a first end of the foregoing sixth switch is at a high level, the first end of the foregoing fifth switch and the first end of the foregoing sixth switch are connected to the foregoing first selection end, a second end of the foregoing fifth switch is used as the foregoing left input end, a second end of the foregoing sixth switch is used as the foregoing right input end, and a third end of the foregoing fifth switch, a third end of the foregoing sixth switch, the first end of the foregoing first switch, the first end of the foregoing second switch, the first end of the third switch, and the first end of the fourth switch are connected. First selection ends of the foregoing at least two circuit units for implementing a shift operation are connected. Each circuit unit for implementing a shift operation in FIG. 7 further includes a first selection end L/R, where the first selection end is configured to choose to perform a left shift operation or perform a right shift operation.

Figure 8:
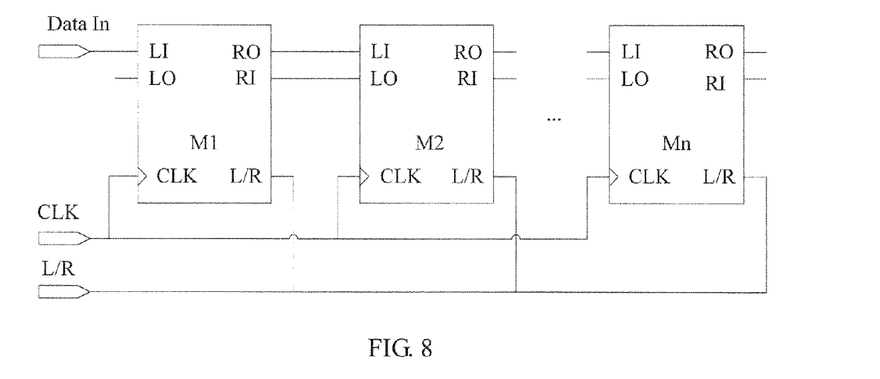
FIG. 8 is a schematic structural diagram of a third embodiment of an array circuit for implementing a shift operation according to the present invention.

FIG. 8 is a schematic structural diagram of a third embodiment of an array circuit for implementing a shift operation according to the present invention. Based on the array circuit shown in FIG. 7, the foregoing circuit unit for implementing a shift operation in FIG. 8 further includes a second selection circuit and a read circuit. The foregoing second selection circuit includes a seventh switch, an eighth switch, a ninth switch, a tenth switch, and a second selection end, where the foregoing seventh switch is closed when a first end of the foregoing seventh switch is at a high level, the foregoing eighth switch is closed when a first end of the foregoing eighth switch is at a low level, the foregoing ninth switch is closed when a first end of the foregoing ninth switch is at a low level, and the foregoing tenth switch is closed when a first end of the foregoing tenth switch is at a high level; the first end of the foregoing seventh switch, the first end of the foregoing eighth switch, the first end of the foregoing ninth switch, and the first end of the foregoing tenth switch are connected to the foregoing second selection end; a third end of the foregoing seventh switch, a third end of the foregoing eighth switch, the first end of the foregoing first switch, the first end of the foregoing second switch, the first end of the foregoing third switch, and the first end of the foregoing fourth switch are connected; a second end of the foregoing seventh switch is connected to the foregoing ground end; a second end of the foregoing eighth switch, the third end of the fifth switch, and the third end of the sixth switch are connected; a second end of the foregoing ninth switch, a second end of the foregoing tenth switch, the third end of the foregoing third switch, and the third end of the foregoing fourth switch are connected; a third end of the foregoing ninth switch is connected to the foregoing ground end; and a third end of the foregoing tenth switch is connected to the foregoing read circuit. The foregoing read circuit includes a latch, a right output end, and a left output end, where the foregoing right output end is connected to a left input end of the circuit unit corresponding to the right 1-bit data, and the foregoing left output end is connected to a right input end of the circuit unit corresponding to the left 1-bit data; a first end of the foregoing latch is connected to the foregoing second selection end, a third end of the foregoing latch is connected to the third end of the foregoing tenth switch, and a second end of the foregoing latch is used as the foregoing right output end or the foregoing left output end. Second selection ends of the foregoing at least two circuit units for implementing a shift operation are connected. Each circuit unit for implementing a shift operation in FIG. 8 further includes a second selection end CLK, where the second selection end is configured to choose to perform a shift operation or perform a read operation.

N-bit data can be shifted once in only one cycle by using the first selection end, and data before shifting and data after shifting that are stored in the resistive random-access memory M are shown in the following table:

|  | Resistive random-access memory | | | |
| --- | --- | --- | --- | --- |
|  | M1 | M2 | ... | Mn − 1 | Mn |
| Before shifting | D1 | D2 | ... | Dn − 1 | Dn |
| 1-bit right shifting | x | D1 | ... | Dn − 2 | Dn − 1 |
| 1-bit left shifting | D2 | D3 | ... | Dn − 1 | x |

It is assumed that one shift operation is implemented on 3-bit data "110"; before shifting, a value in M1 is "1", a value in M2 is "1", and a value in M3 is "0"; a result obtained after one right shift operation is that a value in the M2 is "1", a value in the M3 is "1", and the most significant bit is filled by "0", so that the result of one right shift operation is "011".

It is assumed that one shift operation is implemented on 3-bit data "110"; before shifting, a value in M1 is "1", a value in M2 is "1", and a value in M3 is "0"; a result obtained after one left shift operation is that a value in the M1 is "1", a value in the M2 is "0", and the least significant bit is filled by "0", so that the result of the one right shift operation is "100".

It should be noted that more functions can be implemented by using each circuit unit for implementing a shift operation as a core, and by extending an input signal and an output signal. For example, a barrel shifter can be implemented by a cascaded connection of a last-stage unit to a first-stage unit. Data can be written into a shift array circuit by serially inputting the data at an input end, and data recorded in the shift array circuit can be read by outputting data at an output end.

All foregoing embodiments of the present invention have the following beneficial effects: a quantity of components of a circuit for implementing a shift operation is significantly reduced, a circuit structure and operation steps for implementing a shift operation are simplified, power consumption is reduced, and computational efficiency is improved; in addition, both data before shifting and data after shifting are stored in a resistive random-access memory, and data do not need to be read from the resistive random-access memory and then stored into the resistive random-access memory after computation, which significantly lowers a demand for memory bandwidth and implements a fusion of computation and storage.

Finally, it should be noted that the foregoing embodiments are merely intended for describing the technical solutions of the present invention, but not for limiting the present invention. The embodiments provided in the present application are merely exemplary. A person skilled in the art may clearly understand that, for the purpose of convenient and brief description, in the foregoing embodiments, the descriptions of the embodiments have their respective focuses. For a part that is not described in detail in an embodiment, reference may be made to related descriptions in other embodiments. The embodiments of the present invention, claims, and features disclosed in the accompanying drawings may exist independently, or exist in a combination.

What is claimed is:

1. A circuit for implementing a shift operation, the circuit comprising:
    a resistive random-access memory, a first switch, a second switch, a third switch, and a fourth switch;
    wherein the first switch is closed when a first end of the first switch is at a low level, the second switch is closed when a first end of the second switch is at a high level, the third switch is closed when a first end of the third switch is at a high level, and the fourth switch is closed when a first end of the fourth switch is at a low level;
    wherein a second end of the first switch and a second end of the third switch are connected to a negative input end of the resistive random-access memory;
    wherein a second end of the second switch and a second end of the fourth switch are connected to a positive input end of the resistive random-access memory;
    wherein the first end of the first switch, the first end of the second switch, the first end of the third switch, and the first end of the fourth switch are connected to an output end of a previous-stage circuit for implementing the shift operation;
    wherein a third end of the first switch and a third end of the second switch are connected to a bias voltage end; and
    wherein a third end of the third switch and a third end of the fourth switch are connected to a ground end.

2. The circuit according to claim 1, wherein when configured as a left shift circuit, the output end of the previous-stage circuit is an output end of a circuit corresponding to right 1-bit data.

3. The circuit according to claim 1, wherein when configured as a right shift circuit, the output end of the previous-stage circuit is an output end of a circuit corresponding to left 1-bit data.

4. The circuit according to claim 1, further comprising:
    a first selection circuit comprising a left input end, a right input end, a first selection end, a fifth switch, and a sixth switch, wherein the left input end is connected to a right output end of a circuit corresponding to left 1-bit data, and the right input end is connected to a left output end of a circuit corresponding to right 1-bit data; and
    wherein the fifth switch is closed when a first end of the fifth switch is at a low level, the sixth switch is closed when a first end of the sixth switch is at a high level, the first end of the fifth switch and the first end of the sixth switch are connected to the first selection end, a second end of the fifth switch is used as the left input end, a second end of the sixth switch is used as the right input end, and a third end of the fifth switch, a third end of the sixth switch, the first end of the first switch, the first end of the second switch, the first end of the third switch, and the first end of the fourth switch are connected.

5. The circuit according to claim 4, further comprising:
a second selection circuit and a read circuit;
wherein the second selection circuit comprises a seventh switch, an eighth switch, a ninth switch, a tenth switch, and a second selection end, wherein the seventh switch is closed when a first end of the seventh switch is at a high level, the eighth switch is closed when a first end of the eighth switch is at a low level, the ninth switch is closed when a first end of the ninth switch is at a low level, and the tenth switch is closed when a first end of the tenth switch is at a high level;
wherein the first end of the seventh switch, the first end of the eighth switch, the first end of the ninth switch, and the first end of the tenth switch are connected to the second selection end;
wherein a third end of the seventh switch, a third end of the eighth switch, the first end of the first switch, the first end of the second switch, the first end of the third switch, and the first end of the fourth switch are connected;
wherein a second end of the seventh switch is connected to the ground end;
wherein a second end of the eighth switch, the third end of the fifth switch, and the third end of the sixth switch are connected;
wherein a second end of the ninth switch, a second end of the tenth switch, the third end of the third switch, and the third end of the fourth switch are connected;
wherein a third end of the ninth switch is connected to the ground end; and
wherein a third end of the tenth switch is connected to the read circuit;
wherein the read circuit comprises a latch, a right output end, and a left output end, wherein the right output end is connected to a left input end of the circuit corresponding to the right 1-bit data, and the left output end is connected to a right input end of the circuit corresponding to the left 1-bit data; and
wherein a first end of the latch is connected to the second selection end, a third end of the latch is connected to the third end of the tenth switch, and a second end of the latch is used as the right output end or the left output end.

6. An array circuit for implementing a shift operation, the array circuit comprising:
at least two circuit units for implementing the shift operation, wherein each of the at least two circuit unit for implementing the shift operation comprises:
a resistive random-access memory, a first switch, a second switch, a third switch, and a fourth switch, wherein the first switch is closed when a first end of the first switch is at a low level, the second switch is closed when a first end of the second switch is at a high level, the third switch is closed when a first end of the third switch is at a high level, and the fourth switch is closed when a first end of the fourth switch is at a low level,
wherein a second end of the first switch and a second end of the third switch are connected to a negative input end of the resistive random-access memory,
wherein a second end of the second switch and a second end of the fourth switch are connected to a positive input end of the resistive random-access memory,
wherein the first end of the first switch, the first end of the second switch, the first end of the third switch, and the first end of the fourth switch are connected to an output end of a previous-stage circuit unit for implementing the shift operation,
wherein a third end of the first switch and a third end of the second switch are connected to a bias voltage end, and
wherein a third end of the third switch and a third end of the fourth switch are connected to a ground end.

7. The array circuit according to claim 6, wherein when configured as a left shift array circuit, the output end of the previous-stage circuit unit for implementing the shift operation is an output end of a circuit unit corresponding to right 1-bit data.

8. The array circuit according to claim 6, wherein when configured as a right shift array circuit, the output end of the previous-stage circuit unit for implementing the shift operation is an output end of a circuit unit corresponding to left 1-bit data.

9. The array circuit according to claim 6, wherein each of the circuit units for implementing the shift operation further comprises:
a first selection circuit comprising a left input end, a right input end, a first selection end, a fifth switch, and a sixth switch;
wherein the left input end is connected to a right output end of a circuit unit corresponding to left 1-bit data, and the right input end is connected to a left output end of a circuit unit corresponding to right 1-bit data;
wherein the fifth switch is closed when a first end of the fifth switch is at a low level, the sixth switch is closed when a first end of the sixth switch is at a high level, the first end of the fifth switch and the first end of the sixth switch are connected to the first selection end, a second end of the fifth switch is used as the left input end, a second end of the sixth switch is used as the right input end, and a third end of the fifth switch, a third end of the sixth switch, the first end of the first switch, the first end of the second switch, the first end of the third switch, and the first end of the fourth switch are connected; and
wherein first selection ends of the at least two circuit units for implementing the shift operation are connected.

10. The array circuit according to claim 9, wherein each of the circuit units for implementing the shift operation further comprises:
a second selection circuit and a read circuit;
wherein the second selection circuit comprises a seventh switch, an eighth switch, a ninth switch, a tenth switch, and a second selection end, wherein the seventh switch is closed when a first end of the seventh switch is at a high level, the eighth switch is closed when a first end of the eighth switch is at a low level, the ninth switch is closed when a first end of the ninth switch is at a low level, and the tenth switch is closed when a first end of the tenth switch is at a high level;
wherein the first end of the seventh switch, the first end of the eighth switch, the first end of the ninth switch, and the first end of the tenth switch are connected to the second selection end;
wherein a third end of the seventh switch, a third end of the eighth switch, the first end of the first switch, the first end of the second switch, the first end of the third switch, and the first end of the fourth switch are connected;

wherein a second end of the seventh switch is connected to the ground end;
wherein a second end of the eighth switch, the third end of the fifth switch, and the third end of the sixth switch are connected;
wherein a second end of the ninth switch, a second end of the tenth switch, the third end of the third switch, and the third end of the fourth switch are connected;
wherein a third end of the ninth switch is connected to the ground end;
wherein a third end of the tenth switch is connected to the read circuit;
wherein the read circuit comprises a latch, a right output end, and a left output end, wherein the right output end is connected to a left input end of the circuit unit corresponding to the right 1-bit data, and the left output end is connected to a right input end of the circuit unit corresponding to the left 1-bit data; and
wherein a first end of the latch is connected to the second selection end, a third end of the latch is connected to the third end of the tenth switch, and a second end of the latch is used as the right output end or the left output end; and
second selection ends of the at least two circuit units for implementing the shift operation are connected.

* * * * *